(12) United States Patent
Prikhodko et al.

(10) Patent No.: US 8,319,557 B2
(45) Date of Patent: Nov. 27, 2012

(54) INTEGRATED LINEAR POWER DETECTION IN AN RF POWER AMPLIFIER

(75) Inventors: Dima P. Prikhodko, Reading, MA (US); Hichem BenHedi Abdallah, Cambridge, MA (US)

(73) Assignee: Skyworks Solutions, Inc., Woburn, MA (US)

( * ) Notice: Subject to any disclaimer, the term of this patent is extended or adjusted under 35 U.S.C. 154(b) by 0 days.

(21) Appl. No.: 12/946,178

(22) Filed: Nov. 15, 2010

(65) Prior Publication Data

US 2011/0309883 A1    Dec. 22, 2011

Related U.S. Application Data

(63) Continuation of application No. PCT/US2010/039158, filed on Jun. 18, 2010.

(51) Int. Cl.
*H03F 3/68* (2006.01)
(52) U.S. Cl. .................... 330/295; 330/124 R
(58) Field of Classification Search .............. 330/53, 330/84, 124 R, 286, 295, 288
See application file for complete search history.

(56) References Cited

U.S. PATENT DOCUMENTS

| | | | |
|---|---|---|---|
| 6,670,849 B1 | 12/2003 | Damgaard et al. | |
| 7,256,650 B1 * | 8/2007 | Stockert | 330/295 |
| 7,486,134 B2 | 2/2009 | Chang et al. | |
| 8,005,445 B2 * | 8/2011 | Kuriyama et al. | 330/295 |
| 2004/0185916 A1 | 9/2004 | Chang et al. | |
| 2007/0115053 A1 | 5/2007 | Vaisanen et al. | |
| 2009/0179704 A1 | 7/2009 | Staudinger et al. | |

OTHER PUBLICATIONS

G. Zhang, et al., "A High Performance Balanced Power Amplifier and its Integration into a Front-end Module at PCS Band," IEEE Radio Frequency Integrated Circuits Symposium, 2007, pp. 251-254.
International Search Report and Written Opinion, Application No. PCT/US2010/039158, Mar. 14, 2011.

* cited by examiner

*Primary Examiner* — Khanh V Nguyen
(74) *Attorney, Agent, or Firm* — Knobbe, Martens, Olson & Bear, LLP

(57) ABSTRACT

A radio frequency (RF) power amplifier system having a power detection feature includes a balanced power amplifier, an in-phase branch current detector, an out-of-phase branch current detector, and detection circuitry. The balanced power amplifier includes a phase splitter, an in-phase power amplifier branch, an out-of-phase power amplifier branch, and a phase combiner. The in-phase branch current detector provides an indication of current in the in-phase power amplifier branch. The out-of-phase branch current detector provides an indication of current in the out-of-phase power amplifier branch. The detection circuitry combines the indications of current in the in-phase and out-of-phase power amplifier branches to produce an indication of current in the balanced power amplifier.

25 Claims, 4 Drawing Sheets

INTEGRATED LINEAR POWER DETECTION IN AN RF POWER AMPLIFIER

CROSS-REFERENCE TO RELATED APPLICATIONS

This application is filed under 35 U.S.C. 111(a) as a continuation of International Patent Application Serial No. PCT/US2010/039158, entitled "Integrated Linear Power Detection In An RF Power Amplifier" and filed on Jun. 18, 2010 (Applicant: Skyworks Solutions, Inc. et al.), which International Patent Application designates the United States and is hereby incorporated by reference in its entirety.

BACKGROUND

Cellular telephones (also referred to as handsets) and other such mobile wireless telecommunications devices continue to be improved so that they can communicate increasing amounts of data. For example, in the emerging markets of 3G/3.9G, linear transceiver systems, such as those that communicate in accordance with standards such as WCDMA, WiMAX, EUTRAN-LTE, and other non-constant envelope modulation methodologies, the requirement for highly efficient radio frequency (RF) power amplifiers that exhibit good linearity and power control under voltage standing wave ratio (VSWR) mismatch continues to present challenges.

Various types of power amplifiers are known, including single-ended power amplifiers (not shown) and balanced power amplifiers such as that shown in FIG. 1. As illustrated in FIG. 1, a balanced power amplifier 10 comprises a phase splitter 12, an in-phase power amplifier portion 14, an out-of-phase power amplifier portion 16, and a phase combiner 18. As out-of-phase power amplifier portion 16 is typically 90 degrees out of phase with in-phase power amplifier portion 14, in-phase power amplifier portion 14 can also be referred to as the 0° power amplifier portion, and out-of-phase power amplifier portion 16 can also be referred to as the −90° (or +90° in some embodiments) power amplifier portion. A first resistor 20 coupled to ground terminates the out-of-phase input of balanced power amplifier 10, and a second resistor 22 coupled to ground terminates the isolated output port of balanced power amplifier 10. Phase splitter 12 splits the input signal to be amplified (RF_IN) by providing signals at the in-phase (0°) output of phase splitter 12 and the out-of-phase (−90°) output of phase splitter 12 that are equal in amplitude by differ in phase by 90°. In-phase power amplifier portion 14 amplifies the signal it receives from the in-phase output of phase splitter 12. Out-of-phase power amplifier portion 16 amplifies the signal it receives from the out-of-phase output of phase splitter 12. Phase combiner 18 combines these amplified signals. When there is no mismatch between the two signals, the signals are not distorted, and phase combiner 18 produces an output signal (RF_OUT) that represents an equal combination of the two amplified signals. However, when there is mismatch between the two signals, power amplifier portions 14 and 16 experience opposite output phase impedance changes (i.e., one impedance is higher than the other) that partly compensate each other for linearity performance. This compensation helps maintain a constant current in balanced power amplifier 10. In contrast, under mismatch conditions in a single-ended power amplifier (not shown), a constant current would not be maintained.

Power amplifier power control in mobile wireless telecommunication devices typically involves a feedback loop in which the power amplifier output power is detected. The output power detection scheme is one of the key parameters in maintaining power amplifier linearity and linear power control. Conventionally, a number of output power detection schemes have been used, including: forward power detection using a coupler and a detector; implementing a detector at the power amplifier output, such as a collector voltage detector; and current detection using a current mirror.

Forward power detection can readily be implemented, but it is less effective in a high peak-to-average ratio (PAR) linear transmitter system than in other transmitter systems (e.g., a transmitter system in which the power amplifier is operated in saturation) because, for high impedance phases of the load, the voltage at the collector terminal of the amplifying transistor must be significantly increased in order to maintain the same linear output power. Increasing the collector voltage in this manner can promote undesirable signal compression in the power amplifier.

Another type of conventional RF power amplifier control loop detects output power by detecting the voltage at the collector terminal of the amplifying transistor of the power amplifier. Detecting collector voltage can be more preferable than a forward power detection scheme because VSWR matching circuitry that is commonly included can introduce undesirable phase shift. Holding the collector voltage constant in the closed loop can keep the amount of back-off constant for different VSWR mismatch phases. However, this advantage is achieved at the expense of output power. Even though requirements for output power deviation are not as stringent in a linear system as in a non-linear system, unacceptably large power drop can occur under mismatch conditions.

Still another conventional scheme for detecting RF power amplifier output power uses a current mirror. However, a conventional current mirror scheme cannot readily be used in a linear transmitter system because the current drops for the high impedance phases, causing the input power to increase in the closed loop to maintain the power detection signal equal to the reference signal. This leads to further power amplifier signal compression.

SUMMARY

Embodiments of the present invention relate to a radio frequency (RF) power amplifier system having a power detection feature. The power amplifier system includes a balanced power amplifier having a phase splitter, an in-phase power amplifier branch, an out-of-phase power amplifier branch, and a phase combiner. The power amplifier system further includes an in-phase branch current detector that provides an indication of current in the in-phase power amplifier branch, an out-of-phase branch current detector that provides an indication of current in the out-of-phase power amplifier branch, and detection circuitry that combines the indications of current in the in-phase and out-of-phase power amplifier branches to produce an indication of current in the balanced power amplifier.

Other embodiments are also provided. Other systems, methods, features, and advantages of the invention will be or become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE FIGURES

The invention can be better understood with reference to the following figures. The components within the figures are

DETAILED DESCRIPTION

Figure 1:
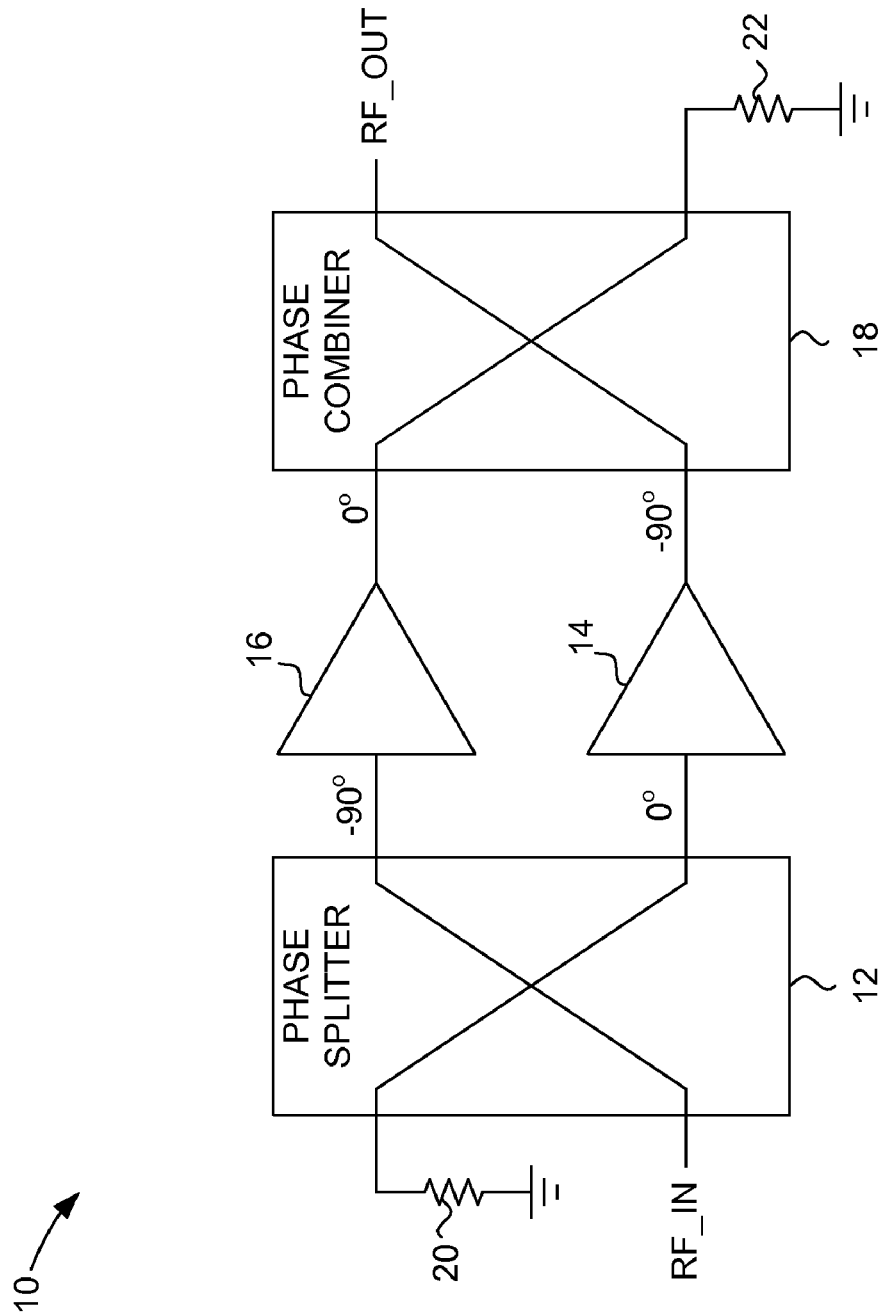
FIG. 1 is a block diagram of a conventional balanced RF power amplifier.
Figure 2:
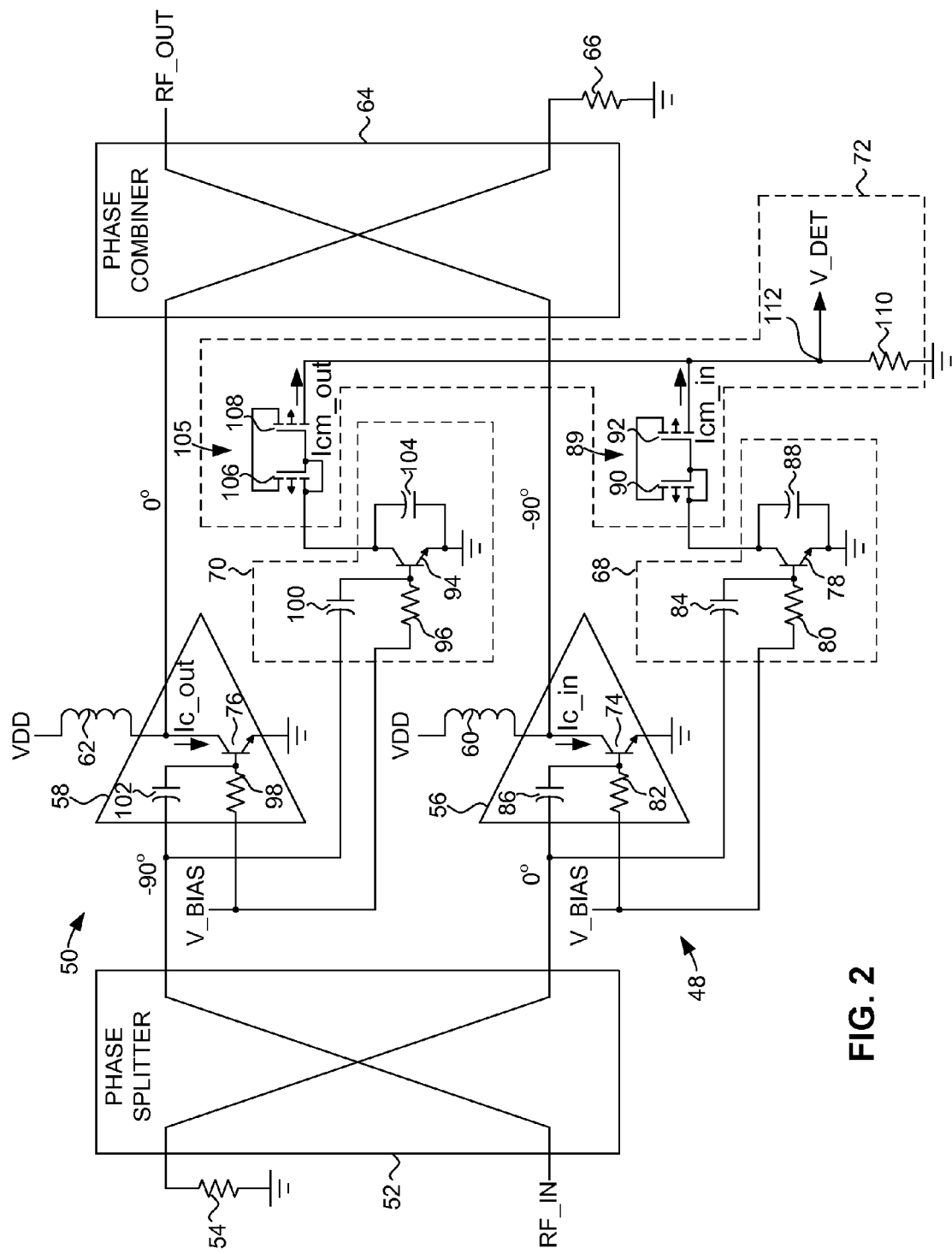
FIG. 2 is a schematic diagram of a power amplifier system having a power detection feature, in accordance with an exemplary embodiment of the present invention.

As illustrated in FIG. 2 in accordance with an exemplary embodiment of the invention, a radio frequency (RF) balanced power amplifier system having a power detection feature has an in-phase branch 48 and an out-of-phase branch 50. An in-phase input of a phase splitter 52 receives the RF signal to be amplified (RF_IN). A resistor 54 terminates the out-of-phase input of phase splitter 52. The in-phase output of phase splitter 52 is coupled to the input of an in-phase power amplifier portion 56. The out-of-phase output of phase splitter 52 is coupled to the input of an out-of-phase power amplifier portion 58. The in-phase and out-of-phase power amplifier branches 48 and 50 include not only power amplifier portions 56 and 58, respectively, but can also include associated circuit elements, such as inductors 60 and 62 through which a fixed or regulated power supply voltage (VDD) is coupled to power amplifier portions 56 and 58, respectively. The output of in-phase power amplifier portion 56 is coupled to an out-of-phase input of a phase combiner 64. The output of out-of-phase power amplifier portion 58 is coupled to an in-phase input of phase combiner 64. Inductors 60 and 62 also serve as portions of impedance-matching networks (capacitors of which are not shown for purposes of clarity) for matching the output impedances of power amplifier portions 56 and 58 with the input impedances of the in-phase and out-of-phase inputs, respectively, of phase combiner 64. A resistor 66 terminates the isolated output port of phase combiner 64.

Phase splitter 52 splits the input signal to be amplified (RF_IN) by providing signals at the in-phase (0°) output of phase splitter 52 and the out-of-phase (−90°) output of phase splitter 52 that are equal in amplitude by differ in phase by 90°. In-phase power amplifier portion 56 amplifies the signal it receives from the in-phase output of phase splitter 12. Out-of-phase power amplifier portion 58 amplifies the signal it receives from the out-of-phase output of phase splitter 52. Phase combiner 64 combines these amplified signals and provides the resulting signal (RF_OUT) at an output port.

An in-phase branch current detector 68, an out-of-phase branch current detector 70, and detection circuitry 72 together detect the output power of the balanced RF power amplifier, i.e., the combined power output of in-phase power amplifier portion 56 and out-of-phase power amplifier portion 58. The output power of the balanced RF power amplifier is related to the sum of the current in in-phase power amplifier portion 56 and out-of-phase power amplifier portion 58. In the embodiment illustrated in FIG. 2, in-phase branch current detector 68 provides an indication of the current in in-phase power amplifier portion 56, out-of-phase branch current detector 70 provides an indication of the current in out-of-phase power amplifier portion 58, and detection circuitry 72 combines these indications by generating a signal representing their sum. In the embodiment illustrated in FIG. 2, the indications of the currents in in-phase power amplifier portion 56 and out-of-phase power amplifier portion 58 are themselves currents (signals). However, as described below with regard to an alternative embodiment, currents in the in-phase and out-of-phase power amplifier portions can alternatively be indicated by voltage signals.

In-phase branch current detector 68 includes replica circuitry comprising a transistor 78 that corresponds to transistor 74 in in-phase power amplifier portion 56, a bias resistor 80 that corresponds to a bias resistor 82 in in-phase power amplifier portion 56, and a coupling capacitor 84 that corresponds to a coupling capacitor 86 in in-phase power amplifier portion 56. The circuitry in in-phase branch current detector 68 thus substantially replicates the amplifying circuitry of in-phase power amplifier portion 56 but for a scaling factor N, where N is a number greater than one. The collector current in transistor 78 of in-phase branch current detector 68 can be one-Nth the collector current of transistor 74 of in-phase power amplifier portion 56. The values of components of the replica circuitry of in-phase branch current detector 68 can be similarly proportional to those of the amplifying circuitry of in-phase power amplifier portion 56. For example, the value or capacitance of coupling capacitor 86 of in-phase power amplifier portion 56 can be N times the value or capacitance of coupling capacitor 84 of in-phase branch current detector 68. Similarly, the value or resistance of bias resistor 82 of in-phase power amplifier portion 56 can be one-Nth the value or resistance of bias resistor 80 of in-phase branch current detector 68. Also, the area of transistor 78 of in-phase branch current detector 68 can be one-Nth the area of transistor 74 (i.e., the area on the chip or die (not shown) on which transistors 74 and 78 are formed).

Accordingly, the in-phase output of phase splitter 52 is coupled via coupling capacitor 86 to the base of transistor 74 of in-phase power amplifier portion 56 and coupled via coupling capacitor 84 to the base of transistor 78 of in-phase branch current detector 68. A bias current V_BIAS biases the base of transistor 74 through bias resistor 82 and also biases the base of transistor 78 through bias resistor 80. A filter capacitor 88 is coupled between the emitter and collector of transistor 78 to filter RF components out of the signal at the collector of transistor 78. The collector of transistor 78 is coupled to the input of a current mirror 89 comprising two FETs 90 and 92. The output of current mirror 89 provides an in-phase current mirror signal $Ic_{m\_}in$, which is equal to Ic_in/N, where Ic_in is the collector current of transistor 74. Although in the exemplary embodiment current mirror 89 comprises FETs 90 and 92, in other embodiments such a current mirror can comprise bipolar transistors or any other suitable circuitry.

Out-of-phase branch current detector 70 includes replica circuitry comprising a transistor 94 that corresponds to transistor 76 in out-of-phase power amplifier portion 58, a bias resistor 96 that corresponds to a bias resistor 98 in out-of-phase power amplifier portion 58, and a coupling capacitor 100 that corresponds to a coupling capacitor 102 in out-of-phase power amplifier portion 58. The circuitry in out-of-phase branch current detector 70 thus substantially replicates the amplifying circuitry of out-of-phase power amplifier portion 58 but for the above-referenced scaling factor N. The collector current in transistor 94 of out-of-phase branch current detector 70 can be one-Nth the collector current of transistor 76 of out-of-phase power amplifier portion 58. The values of components of the replica circuitry of out-of-phase branch current detector 70 can be similarly proportional to those of the amplifying circuitry of out-of-phase power amplifier portion 58. For example, the value or capacitance of coupling capacitor 102 of out-of-phase power amplifier portion 58 can be N times the value or capacitance of coupling capacitor 100 of out-of-phase branch current detector 70. Similarly, the value or resistance of bias resistor 98 of out-of-phase power amplifier portion 58 can be one-Nth the value or resistance of bias resistor 96 of out-of-phase branch current detector 70. Also, the area of transistor 94 of out-of-phase branch current detector 70 can be one-Nth the area of transistor 76 (i.e., the area on the chip or die (not shown) on which transistors 94 and 98 are formed).

Accordingly, the out-of-phase output of phase splitter 52 is coupled via coupling capacitor 102 to the base of transistor 76 of out-of-phase power amplifier portion 58 and coupled via coupling capacitor 100 to the base of transistor 94 of out-of-phase branch current detector 70. A bias current V_BIAS biases the base of transistor 76 through bias resistor 98 and also biases the base of transistor 94 through bias resistor 96. A filter capacitor 104 is coupled between the emitter and collector of transistor 94 to filter RF components out of the signal at the collector of transistor 94. The collector of transistor 94 is coupled to the input of a current mirror 105 comprising two FETs 106 and 108. The output of current mirror 105 provides an out-of-phase current mirror signal $Ic_{m\_}out$, which is equal to Ic_out/N, where Ic_out is the collector current of transistor 74. (In FIG. 2, the signals $Ic_{m\_}in$ and $Ic_{m\_}out$ are labeled "Icm_in" and "Icm_out" for readability.) Although in the exemplary embodiment current mirror 105 comprises FETs 106 and 108, in other embodiments such a current mirror can comprise bipolar transistors or any other suitable circuitry.

In the embodiment shown in FIG. 2, detection circuitry 72 can comprise a resistor 110, the transistor pair 90 and 92 defining current mirror 89, and the transistor pair 106 and 108 defining current mirror 105. The currents $Ic_{m\_}in$ and $Ic_{m\_}out$ provided by the two current mirrors 89 and 105 are summed at a circuit node 112, yielding a detection signal V_DET across resistor 110 at circuit node 112. The detection signal V_DET has a value or voltage that represents or indicates the output power in the balanced power amplifier as a whole. The detection signal V_DET in FIG. 2 can be provided to elements of a power amplifier control loop in a manner similar to that in which similar power amplifier output power detection signals are conventionally used in a power amplifier control loop to generate a feedback or error signal to control the power amplifier. Although control of the balanced power amplifier is not shown in FIG. 2 for purposes of clarity, this aspect is well understood by persons skilled in the art to which the invention relates. An example of power amplifier power control in a mobile wireless telecommunication device is described in U.S. Pat. No. 6,670,849. Although power amplifier control is in itself well understood, FIG. 3 illustrates the inclusion of the above-described balanced power amplifier system, with its power detection feature, in an exemplary mobile wireless telecommunication device 114 (transceiver), such as a cellular telephone handset or similar device.

Figure 3:
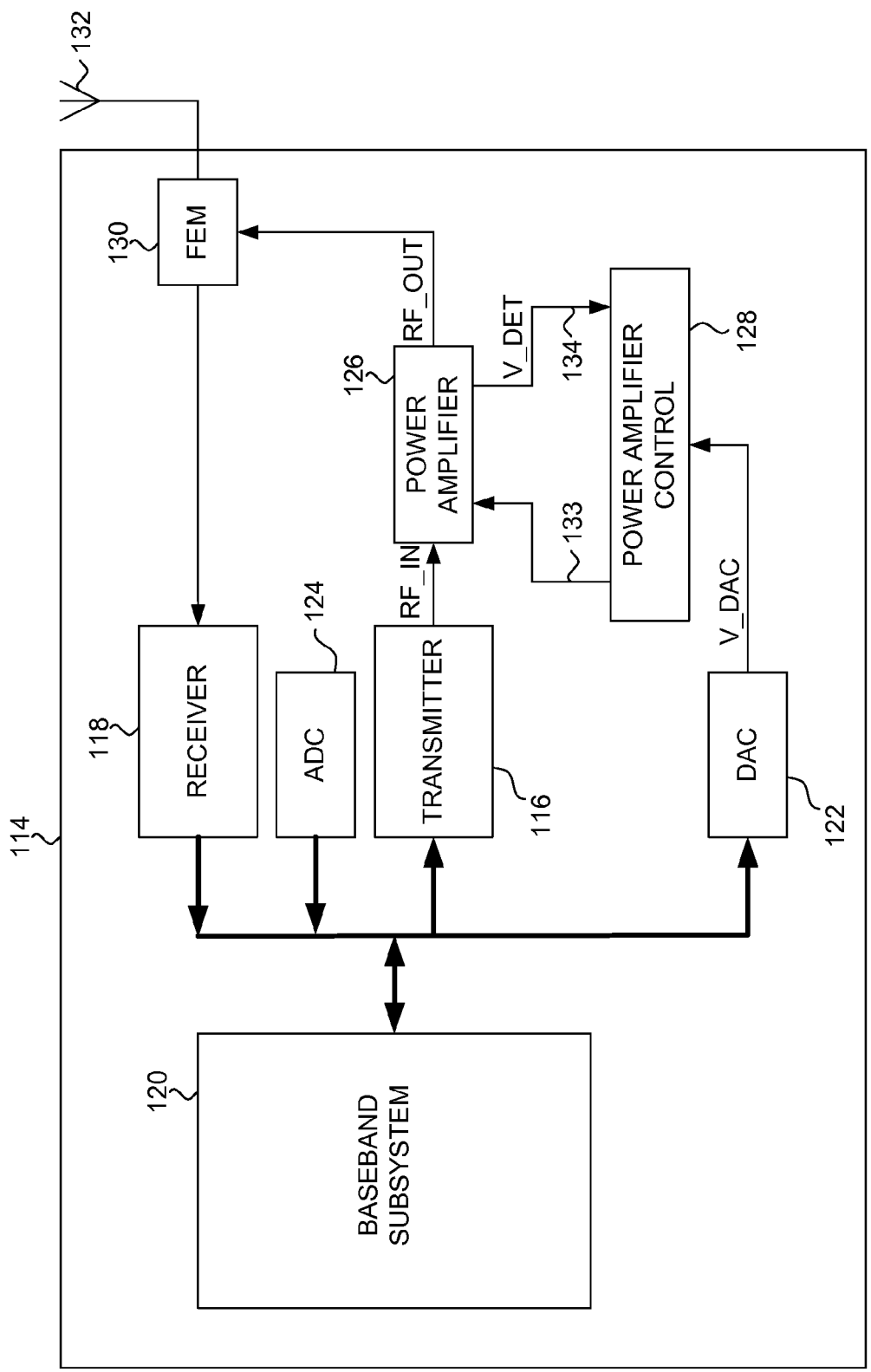
FIG. 3 is a block diagram of an exemplary mobile wireless telecommunications device that includes a power amplifier system in accordance with the present invention.

As illustrated in FIG. 3, mobile wireless telecommunication device 114 includes an RF transmitter 116, an RF receiver 118, a baseband subsystem 120, a digital-to-analog converter (DAC) 122, and an analog-to-digital converter (ADC) 124 that can communicate with one another via a digital bus. Transmitter 116 can include a modulator, an upconverter, and any other functional elements that modulate and upconvert a baseband signal. The receiver 118 includes filter circuitry, downconverter circuitry and demodulation circuitry that enable the recovery of the information signal from the received RF signal. Mobile wireless telecommunication device 114 also includes a power amplifier system 126 and a power amplifier controller 128. The output of transmitter 116 is provided to power amplifier system 126. Receiver 118 and power amplifier system 126 are connected to a front end module 130. Front end module 130 can be a duplexer, a diplexer, or any element that separates the transmit signal from the receive signal. Front end module 130 is connected to an antenna 132. In transmit mode, the output of power amplifier system 126 (RF_OUT) is provided to front end module 130. In receive mode, front end module 130 provides a receive signal to receiver 118.

In transmit mode, baseband subsystem 120 can select a power level at which power amplifier 126 is to transmit by providing an indication of the power level to DAC 122, which in turn provides a corresponding power control voltage (V_DAC) to power amplifier controller 128. Power amplifier controller responds to the control voltage by providing a power control signal 133 (V_PC) to power amplifier system 126 that causes power amplifier system 126 to amplify an input signal (RF_IN) at the selected amplification level or gain. In accordance with the above-described feedback control principles, power amplifier system 126 provides the output power detection signal (V_DET) 134 to power amplifier controller 128. In response to the output power detection signal, power amplifier controller 128 can adjust control signal 132 to maintain the output power at the selected level.

Figure 4:
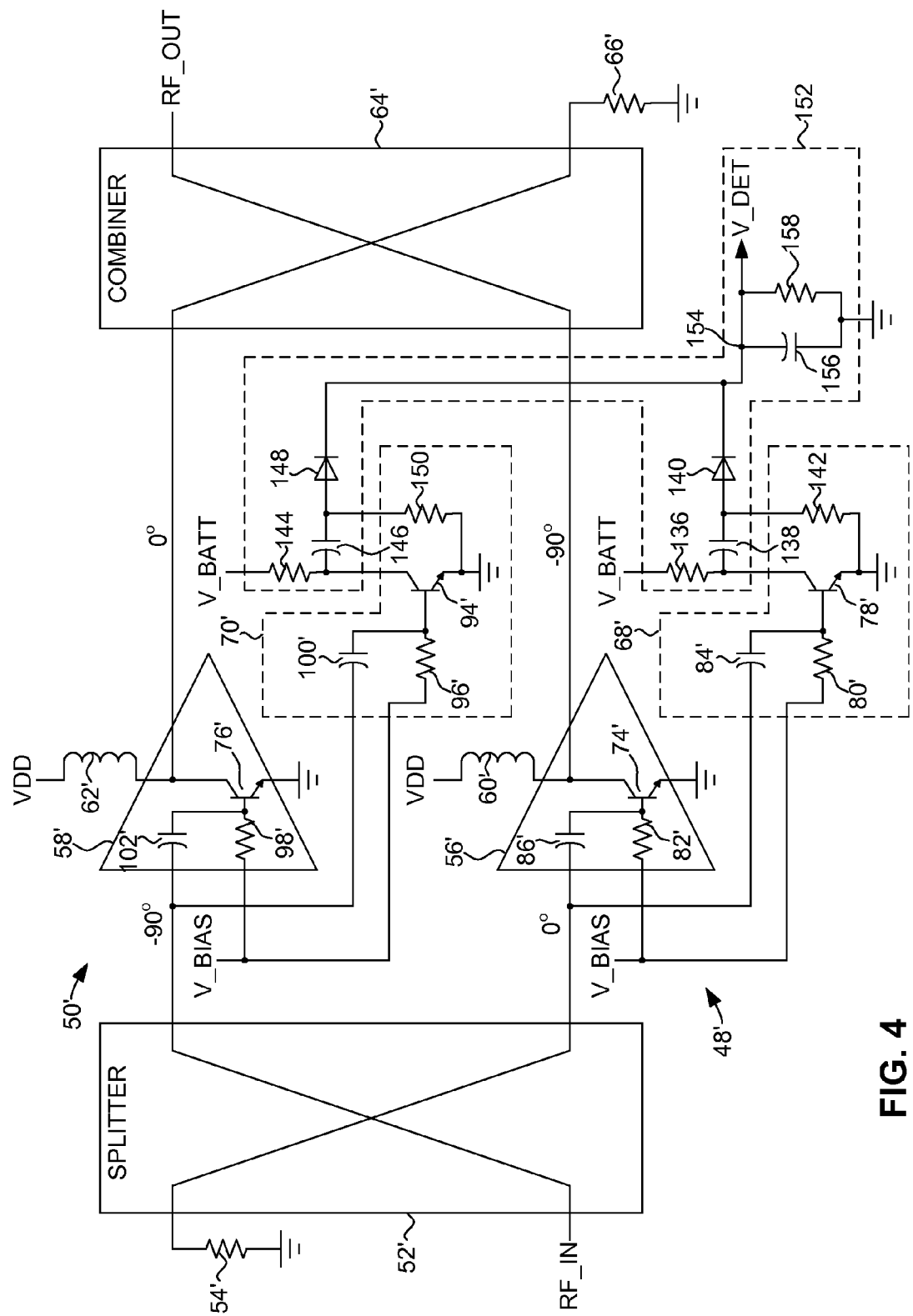
FIG. 4 is a schematic diagram of a power amplifier system having a power detection feature, in accordance with another exemplary embodiment of the present invention.

An alternative embodiment of the system described above with regard to FIG. 2 is shown in FIG. 4. Descriptions of elements of this system that are identical to those described above with regard to FIG. 2, which are indicated by the "prime" symbol in the reference numerals, are not repeated here. The difference between the embodiment shown in FIG. 2 and the embodiment shown in FIG. 4 is that in the embodiment shown in FIG. 2 each current mirror couples only DC and low frequency signals, i.e., the RF signal is filtered out, while in the embodiment shown in FIG. 4 resistors 136 and 144 convert the respective collector currents of transistors 78' and 94' into voltages, which are then detected by peak detectors (diodes) 140 and 148, respectively.

More specifically, in the illustrated embodiment the collector of transistor 78' of in-phase branch current detector 68' is coupled to a battery voltage (V_BATT) or similar voltage via a resistor 136. A coupling capacitor 138 couples the output of the collector of transistor 78' to the input of diode 140. A bias resistor 142 is coupled between ground potential and the input of diode 140. Similarly, the collector of transistor 94' of out-of-phase branch current detector 70' is coupled to the battery voltage (V_BATT) via a resistor 144. A coupling capacitor 146 couples the output of the collector of transistor 70' to the input of diode 148. A bias resistor 150 is coupled between ground potential and the input of diode 148.

Detection circuitry 152 in this embodiment includes the above-described resistors 136 and 144, diodes 140 and 148, and a capacitor 156 and resistor 158. Capacitor 156 and resistor 158 are in parallel with each other and coupled between circuit node 154 and ground. Capacitor 156 and resistor 158 serve to sum the voltages provided detected by peak detectors (diodes) 140 and 148. The sum of these voltages yields a detection signal V_DET at circuit node 154 having a voltage that indicates the output power in the balanced power amplifier as a whole.

While various embodiments of the invention have been described, it will be apparent to those of ordinary skill in the art that many more embodiments and implementations are possible that are within the scope of the invention. For example, the invention is not limited to a specific type of radio transmitter o power amplifier. Embodiments of the invention are applicable to different types of radio transmitters and power amplifiers and are applicable to any transmitter that transmits a non-constant envelope signal.

What is claimed is:

1. A mobile wireless telecommunication device, comprising:
an antenna;
a radio frequency (RF) receiver system coupled to the antenna;
an RF transmitter system;
a baseband subsystem coupled to the RF transmitter system and the RF receiver system; and
a power amplifier system having an input coupled to an output of the RF transmitter system and an output coupled to the antenna, the power amplifier system including a balanced power amplifier and a power detector, the balanced power amplifier having an in-phase power amplifier portion and an out-of-phase power amplifier portion, the power detector including an in-phase replica circuit replicating amplifying circuitry of the in-phase power amplifier portion coupled to an in-phase current mirror, the power detector providing an indication of current in the balanced power amplifier to the baseband subsystem in response to a combination indicative of current in the in-phase power amplifier portion and current in the out-of-phase power amplifier portion, the combination generated based on an output of the in-phase current mirror coupled to the in-phase power amplifier portion via the in-phase replica circuit and an output of an out-of-phase current mirror coupled to the out-of-phase power amplifier portion.

2. The mobile wireless telecommunication device of claim 1 wherein the power detector includes a current-summing node, the current-summing node producing a voltage indicating current in the balanced power amplifier in response to a sum of current at the output of the in-phase current mirror and current at the output of the out-of-phase current mirror.

3. A method for detecting power in a radio frequency (RF) power amplifier system, the RF power amplifier system including a balanced power amplifier having an in-phase power amplifier branch and an out-of-phase power amplifier branch, the method comprising:
generating an indication of current in the in-phase power amplifier branch based on an output of an in-phase diode-based current-to-voltage converter coupled to the in-phase power amplifier branch;
generating an indication of current in the out-of-phase power amplifier branch based on an output of an out-of-phase diode-based current-to-voltage converter coupled to the out-of-phase power amplifier branch; and
combining the indication of current in the in-phase power amplifier branch and the indication of current in the out-of-phase power amplifier branch to produce an indication of current in the balanced power amplifier.

4. The method of claim 3 further comprising providing an indication of current in the in-phase power amplifier branch to the in-phase diode-based current-to-voltage converter via an in-phase replica circuit.

5. The method of claim 4 further comprising providing an indication of current in the in-phase power amplifier branch to the out-of-phase diode-based current-to-voltage converter via an out-of-phase replica circuit.

6. A radio frequency (RF) power amplifier system with power detection, comprising:

a balanced power amplifier including an in-phase power amplifier portion and an out-of-phase power amplifier portion; and
a power detector including an in-phase current mirror, an out-of-phase current mirror, an in-phase replica circuit coupled to the in-phase current mirror, the in-phase replica circuit configured to replicate amplifying circuitry of the in-phase power amplifier portion, and an out-of-phase replica circuit coupled to the out-of-phase current mirror, the out-of-phase replica circuit configured to replicate amplifying circuitry of the out-of-phase power amplifier portion, the power detector configured to generate an indication of output power of the balanced power amplifier based on a combination of an output of the in-phase current mirror and an output of the out-of-phase current mirror.

7. The RF power amplifier system of claim 6 wherein an input of the in-phase current mirror is coupled to a collector of a transistor of the in-phase replica circuit.

8. The RF power amplifier system of claim 7 wherein a collector current in the transistor of the in-phase replica circuit is 1/N of a collector current of a corresponding transistor of the in-phase power amplifier portion, where N is a number greater than one.

9. The RF power amplifier system of claim 8 wherein the in-phase replica circuit includes a replica circuit capacitor coupled between an in-phase output of a phase splitter and a base of the transistor of the in-phase replica circuit and a replica circuit bias resistor coupled between the base of the transistor of the in-phase replica circuit and a fixed bias voltage.

10. The RF power amplifier system of claim 9 wherein the in-phase power amplifier portion includes an amplifier capacitor coupled between the in-phase output of the phase splitter and a base of a transistor of the in-phase amplifier portion and an amplifier bias resistor coupled between the base of the transistor of the in-phase replica circuit and the fixed bias voltage, the amplifier coupling capacitor having a capacitance N times the capacitance of the replica circuit capacitor and the replica circuit bias resistor having a resistance 1/N times the resistance of the amplifier bias resistor.

11. The RF power amplifier system of claim 8 wherein a collector current in a transistor of the out-of-phase replica circuit is 1/N of a collector current of a corresponding transistor of the out-of-phase power amplifier portion.

12. The RF power amplifier system of claim 6 wherein the in-phase replica circuit includes a capacitor configured to filter RF components from an output of the in-phase replica circuit.

13. The RF power amplifier system of claim 12 wherein the capacitor is coupled between a collector and an emitter of the transistor in the in-phase replica circuit.

14. An RF power amplifier system with power detection, comprising:
a balanced power amplifier including an in-phase power amplifier portion and an out-of-phase power amplifier portion; and
a power detector having an in-phase replica circuit configured to replicate amplifying circuitry of the in-phase power amplifier portion and an out-of-phase replica circuit configured to replicate amplifying circuitry of the out-of-phase power amplifier portion, the in-phase replica circuit including a first capacitor coupled between a collector and an emitter of a transistor in the in-phase replica circuit, the out-of-phase replica circuit including a second capacitor coupled between a collector and an emitter of a transistor in the out-of-phase replica circuit, the power detector configured to generate an indication of output power of the balanced power amplifier in response to a combination indicative of current in the in-phase power amplifier portion and current in the out-of-phase power amplifier portion.

15. The RF power amplifier system of claim 14 wherein a collector current in a transistor of the out-of-phase replica circuit is 1/N of a collector current of a corresponding transistor of the out-of-phase power amplifier portion, where N is an integer.

16. The RF power amplifier system of claim 14 wherein the power detector includes an in-phase current mirror coupled to the in-phase replica circuit and an out-of-phase current mirror coupled to the out-of-phase replica circuit.

17. The RF power amplifier system of claim 14 wherein the power detector includes an in-phase diode-based current-to-voltage converter coupled to the in-phase replica circuit and an out-of-phase diode-based current-to-voltage coupled to the out-of-phase replica circuit.

18. The mobile wireless telecommunication device of claim 1 wherein a collector current in a transistor of the in-phase replica circuit is 1/N of a collector current of a corresponding transistor of the in-phase power amplifier portion, where N is an integer.

19. The mobile wireless telecommunication device of claim 1 wherein the in-phase replica circuit includes a capacitor configured to filter RF components from an output of the in-phase replica circuit.

20. The method of claim 4 wherein a collector current in a transistor of the in-phase replica circuit is 1/N of a collector current of a corresponding transistor of the in-phase power amplifier portion, where N is an integer.

21. An RF power amplifier system with power detection, comprising:
a power amplifier including an in-phase power amplifier portion and an out-of-phase power amplifier portion; and
detection circuitry including an in-phase diode-based current-to-voltage converter configured to generate an indication of current in the in-phase power amplifier portion and an out-of-phase diode-based current-to-voltage converter configured to generate an indication of current in the out-of-phase power amplifier portion, the in-phase diode-based current-to-voltage converter coupled to the in-phase power amplifier portion, the out-of-phase diode-based current-to-voltage converter coupled to the out-of-phase power amplifier portion, and the detection circuitry configured to generate an indication of output power of the power amplifier based on a combination of an output of the in-phase diode-based current-to-voltage converter and an output of the out-of-phase diode-based current-to-voltage converter.

22. The RF power amplifier system of claim 21 wherein the detection circuitry includes a voltage summer configured to generate the indication of output power of the power amplifier by summing the output of the in-phase diode-based current-to-voltage converter and the output of the out-of-phase diode-based current-to-voltage converter.

23. The RF power amplifier system of claim 21 wherein the detection circuitry includes an in-phase replica circuit having an output coupled to an input of the in-phase diode-based current-to-voltage converter, the in-phase replica circuit configured to replicate amplifying circuitry of the in-phase power amplifier portion.

24. The RF power amplifier system of claim 23 wherein the in-phase replica circuit includes a transistor having a collector current that is 1/N of a collector current of a transistor of the in-phase power amplifier portion, where N is an integer.

25. The RF power amplifier system of claim 23 wherein the detection circuitry includes an out-of-phase replica circuit having an output coupled to an input of the out-of-phase diode-based current-to-voltage converter, the out-of-phase replica circuit configured to replicate amplifying circuitry of the out-of-phase power amplifier portion.

\* \* \* \* \*

UNITED STATES PATENT AND TRADEMARK OFFICE
CERTIFICATE OF CORRECTION

PATENT NO. : 8,319,557 B2
APPLICATION NO. : 12/946178
DATED : November 27, 2012
INVENTOR(S) : Prikhodko et al.

Page 1 of 1

It is certified that error appears in the above-identified patent and that said Letters Patent is hereby corrected as shown below:

Title Page 1 (item 75 Inventors) at line 2, change "Hichem BenHedi Abdallah," to --Hichem Ben Hedi Abdallah,--.

Signed and Sealed this
Twelfth Day of November, 2013

Teresa Stanek Rea
*Deputy Director of the United States Patent and Trademark Office*